United States Patent [19]
Liu et al.

[11] Patent Number: 6,156,660
[45] Date of Patent: Dec. 5, 2000

[54] METHOD OF PLANARIZATION USING DUMMY LEADS

[75] Inventors: Chi-Wen Liu, Hsinchu; Chia-Shiung Tsai, Hsin-Chu; Jing-Meng Liu, Hsin Chu; Tsu Shih, Hsinchu, all of Taiwan

[73] Assignee: Taiwan Semiconductor Manufacturing Company, Hsin-Chu, Taiwan

[21] Appl. No.: 09/244,883

[22] Filed: Feb. 5, 1999

[51] Int. Cl.[7] .......................... H01L 21/44; H01L 21/461
[52] U.S. Cl. .......................... 438/692; 438/691; 438/612; 438/742; 438/743; 438/744
[58] Field of Search ..................... 438/612, 598, 438/611, 597, 756, 692, 743, 691, 123, 742, 619, 744, 18; 257/737, 779, 784; 430/318

[56] References Cited

U.S. PATENT DOCUMENTS

| | | | |
|---|---|---|---|
| 5,593,903 | 1/1997 | Beckenbaugh et al. | 437/8 |
| 5,696,406 | 12/1997 | Ueno | 257/784 |
| 5,700,735 | 12/1997 | Shiue et al. | 438/612 |
| 5,707,894 | 1/1998 | Hsiao | 437/209 |
| 5,911,110 | 6/1999 | Yu | 438/424 |

*Primary Examiner*—John F. Niebling
*Assistant Examiner*—Ha Tran Nguyen
*Attorney, Agent, or Firm*—George O. Saile; Stephen B. Ackerman

[57] ABSTRACT

An Integrated Circuit Design which adds, to the standard conducting lines of the bulk metal layer, a pattern of a support structure which supports subsequent deposition in such a way that it eliminates previously experienced concavity or dishing of the subsequent deposition within areas which have a low density or absence of conducting lines. The dummy pattern enhances the deposition of filler material between conducting lines of the Integrated Circuit such that planarization of the bulk metal results in a smoother surface of the areas of the signal lines of the integrated circuit and within large open areas. Concurrently the present invention provides a means of successfully collecting data that are needed for Damascene processing.

15 Claims, 3 Drawing Sheets

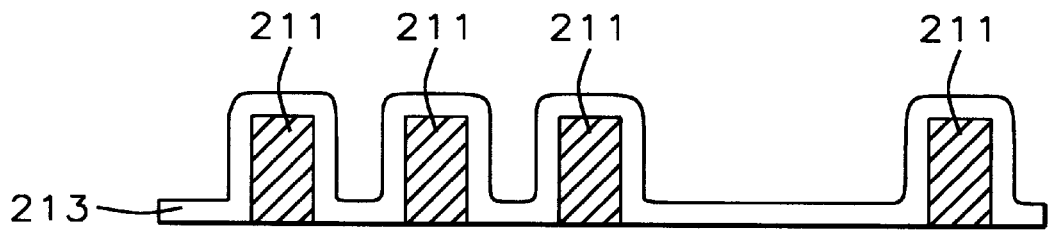
FIG. 1 – Prior Art
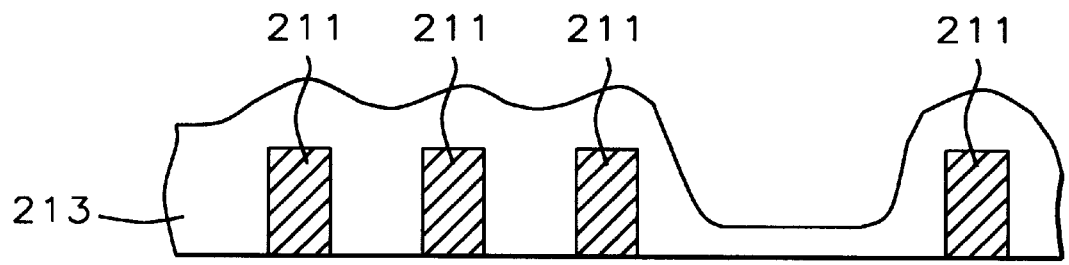
FIG. 2 – Prior Art
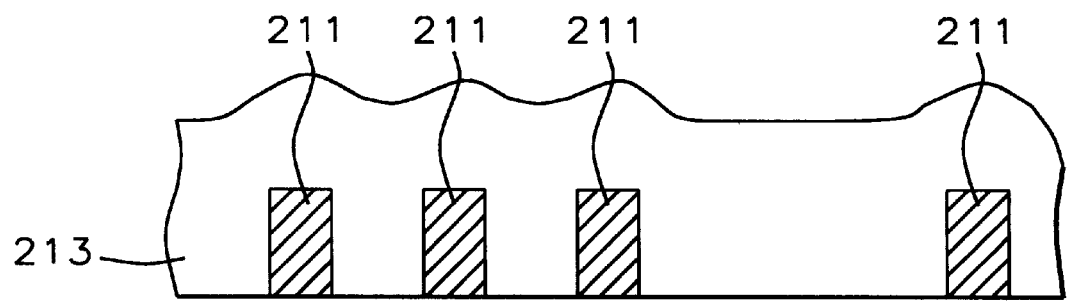
FIG. 3 – Prior Art

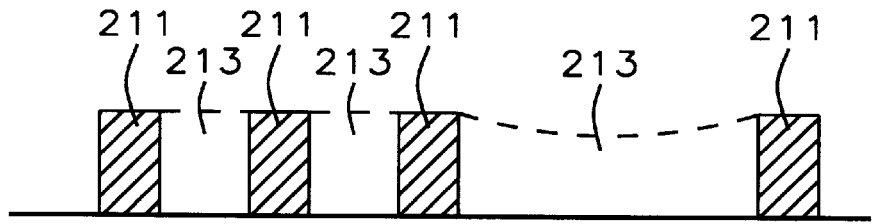
FIG. 4 - Prior Art
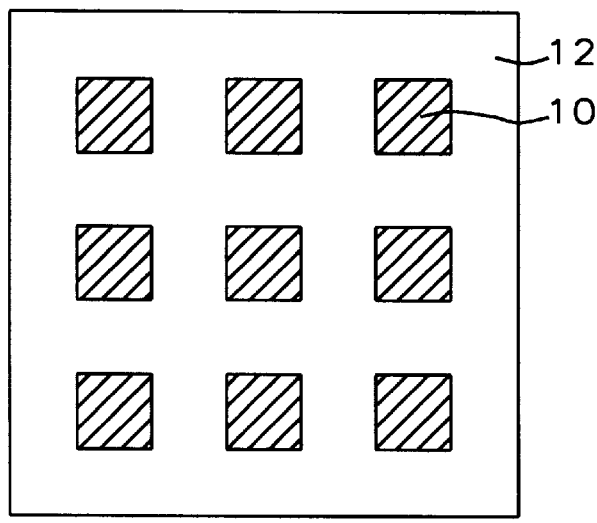
FIG. 5a
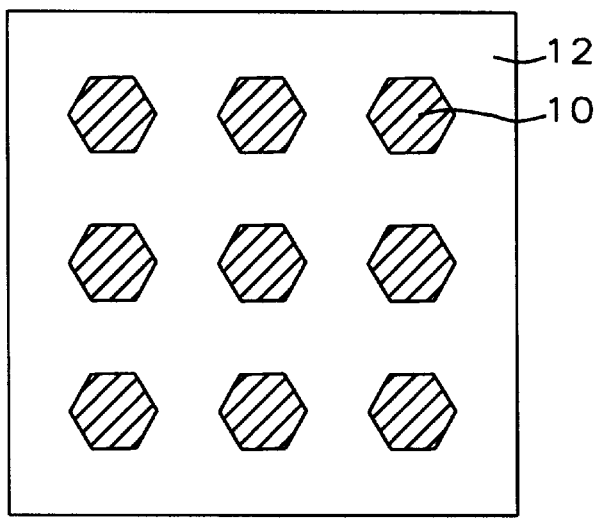
FIG. 5b

METHOD OF PLANARIZATION USING DUMMY LEADS

1. FIELD OF THE INVENTION

The invention relates to the fabrication of Integrated Circuit (IC) Devices, and more specifically to the design of an improved Bulk Pattern Design in metal Chemical Vapor Deposition (CVD) and metal Chemical Mechanical Planarization (CMP) for Damascene application.

2. DESCRIPTION OF THE PRIOR ART

The damascene process derives its name from the ancient art of inlaying metal in ceramic or wood for decorative purposes. The damascene process has been demonstrated on a number of applications. The most commonly applied process is the first metal or local interconnect metal layers where in present day applications CMP is used exclusively. The damascene process does however require a flat topography to start with and therefore needs complete gap fill between metal lines and the avoidance of dishing in large open areas. Complete gap fill between metal lines of an Integrated Circuit structure has been difficult to achieve using present day technologies, it is therefore necessary to implement a modified pattern design which addresses these problems. This modified pattern design must address both the problems of dishing in large open areas and the problem of incomplete or marginal filling of the areas between deposited metal lines. The present invention addresses these areas in full.

After completion of the fabrication of an integrated circuit, it is usually further assembled into a package to be utilized within the next level of integration of a larger circuit. Bond pads are often used to make these electrical connections, bulk metal is deposited on top of the substrate surface as a first step in the formation of the bond pads. Metal contacts are formed within the deposited bulk metal layer, which are used as bonding pads of the fabricated integrated circuit. These metal contacts allow for the connection of the integrated circuit to the next level of packaging by means of conducting leads.

It is of critical importance that the connection made at the bonding pad of the semiconductor circuit can withstand critical values of tensile and shear forces without failure.

Examples of conventional Chemical Vapor Deposition and Chemical Mechanical Planarization are shown in cross-sectional view in FIGS. 1 through 4.

FIG. 1 shows a cross-sectional view of the initial Chemical Vapor Deposition. Filler material 213 is deposited over insulators 211. Note that not all insulators are spaced at equal distances from each other and that a large open area can exist between insulators 211. FIG. 1 also shows that during the initial phase of the deposition, there are deep gaps in the deposition material between the insulating lines.

FIG. 2 shows the profile of the deposition material in cross-sectional view after the CVD has been completed. The presence of the lower insulating layer 211 causes the inter layer conducting filler 213 to have stepped portions, these gaps can result in uneven surface of the surface after polishing of the filler material.

FIG. 3 shows the profile of the filler material in cross-sectional view before Chemical Mechanical Planarization (CMP).

FIG. 4 shows the profile of the filler material after CMP. It demonstrates the concavity or dishing characteristics of the filler surface in a large, open area.

U.S. Pat. No. 5,700,735 (Shiue et al.) shows a bond pad structure which uses three metal pads and a method of forming the bond pad structure with the formation of via plugs.

U.S. Pat. No. 5,707,894 (Hsiao) shows an improved bonding pad, which resists bond pad peeling with the formation of a plurality of anchor gaps.

U.S. Pat. No. 5,593,903 (Beckenbaugh et al.) shows a contact pad which allows for Wafer Level Testing and burn-in of the semiconductor die.

SUMMARY OF THE INVENTION

It is the principle objective of the present invention to provide a bond pad structure which provides adequate tensile strength and shear strength for a bond formed on the bond pad structure as well as reducing the frequency of bond pad peeling and cracking.

A further object of the present invention is to address and solve problems of incomplete gap fill between metal lines within the structure of the Integrated Circuit area and to eliminate the therefrom following problems of uneven planarization after the CMP process.

A further object of the present invention is to avoid problems of surface concavity or dishing of the filler material in large open areas during metal CMP.

A further objective of the present invention is to provide a method of improved penetration of filler material between adjacent insulator leads of the electrical circuit etched within the bulk metal which results in a smooth and well controlled surface after etch back of the filler material.

A further objective of the present invention is to assure successful collection of Electrical Data for Damascene processing.

Moreover, contact pads are needed to allow for wafer level testing and burn-in of semiconductor die.

Moreover, bond pads are required to connect the integrated circuit to surrounding electrical circuits and components.

The above indicated objectives are obtained by adding dummy patterns to the areas between insulator lines of the electrical circuits contained within the bulk metal of the semiconductor pattern. These open areas lead to problems of not being completely or evenly filled during metal CVD. In addition, the gaps between the insulator lines of these circuits are often not completely filled leading to discontinuities of the metal surface after CMP. These problems in turn lead to difficulties of successfully collecting electrical data for Damascene application.

It must be emphasized at this point that the addition of dummy patterns to the existing semiconductor circuit patterns is valid for and applies with equal importance to both large open areas within the Integrated Circuit layout and to the areas between bulk metal lines contained within the circuits. This application of dummy patterns results in better fill in bulk metal circuit lines with subsequent improved planarization after CMP and in the elimination of dishing or surface concavity after CMP of large open areas.

Accordingly, the present invention provides a structure and process to form an improved bonding pad in a bonding pad area that resists bonding pad peeling. In addition, the present invention also provides a structure and method to improve planarization of the Integrated Circuit during wafer processing by adding dummy patterns to the existing bulk metal circuit lines contained within the IC.

The method begins by providing a semiconductor substrate having active and passive devices formed therein and thereon. A first dielectric layer is formed on the substrate surface and is patterned to form the insulator leads for the semiconductor circuits which is supplemented with a pattern of dummy leads within areas of a relatively open geometry to accommodate or allow the deposition of the dummy leads. A filler layer is deposited over the insulating leads and the pattern of the dummy leads then etched back to the level of the top of the insulating leads and the dummy filler leads.

Briefly, the structure of bulk metal for bonding pad and bulk metal for Damascene comprises: a semiconductor substrate having active and passive devices formed therein and thereon; dielectric deposited on top of the semiconductor substrate; a plurality of dummy leads formed within the dielectric in a pattern to fill areas of significant spacing between insulating leads within the electrical circuit; a filler material deposited over the insulating leads of the semiconductor circuits within the substrate and also deposited over the dummy lead pattern within the dielectric layer; an etch back of the filler material to the level of the top of the semiconductor leads which is also the level of the top of the dummy leads.

BRIEF DESCRIPTION OF THE DRAWINGS

FIGS. 1 through 4 relate to the prior art deposition process.

FIG. 1 shows a cross-sectional view of the bulk metal gap-fill during initial metal Chemical Vapor Deposition.

FIG. 2 shows a cross-sectional view of the bulk metal gap-fill during final metal Chemical Vapor Deposition.

FIG. 3 shows a cross-sectional view before bulk metal Chemical Mechanical Processing.

FIG. 4 shows a cross-sectional view of "dishing" after bulk metal Chemical Mechanical Processing.

FIGS. 5 through 9 refer to the present invention.

FIG. 5a and FIG. 5b show a plan view of new bulk metal structures, which form an integral part of the present invention.

FIG. 6 shows a cross-sectional view of a substrate with silicon oxide device structures together with the dummy patterns that are an integral part of the present invention.

FIG. 7 shows FIG. 6 after filler deposition.

FIG. 8 shows a cross-sectional view after Chemical Mechanical Processing.

FIG. 9 shows a plan view of the preferred use or application of the present invention.

DETAILED DESCRIPTION OF THE PREFERRED EMBODIMENTS

Accordingly, the present invention provides a method of forming an improved bonding pad (due to the reduction in metal Chemical Mechanical Planarization concavity formation), the avoidance of the Chemical Vapor Deposition gap fill problem while the present invention assures the collection of Electrical Data required for Damascene processing.

Referring now more specifically to FIG. 5a and FIG. 5b, there is shown a plan view of two examples of the new bulk metal structure 12 of the preferred embodiment of the present invention. These bulk structures 12 are deposited within substrate 10 in areas where adequate spacing, between insulating islands of the semiconductor circuits contained within the substrate, allows this deposition. These bulk structures 12 form a dummy pattern that can be deposited using standard semiconductor deposition techniques.

The substrate 10 can include a top surface layer of insulating material formed from a material, the term substrate means to include devices within a semiconductor wafer and the layers overlaying the wafer. The term substrate surface is meant to include the upper most exposed layers on a semiconductor wafer, such as a silicon surface, an insulating layer and metallurgy lines.

The geometry of the cross section of the dummy leads is not critical, the cross sections of the dummy leads shown in FIG. 5a and FIG. 5b does not mean to limit the possible dummy leads to the cross sections shown, any form other than the forms indicated and which lends itself to semiconductor manufacturing processes can be applied as part of the present invention.

The geometry of positioning of the dummy leads with respect to each other is not critical. The cross sections of the relative location with respect to each other, of the dummy leads shown in FIG. 5a and FIG. 5b, does not mean to limit the possible placement of the dummy leads to the cross sections shown. Any geometric pattern other than the geometric pattern indicated and which lends itself to semiconductor manufacturing processes can be applied as part of the present invention. the dummy leads are formed using reverse tone mask processing. After the dummy leads are formed, forming a dielectric layer on the substrate surface.

Materials used for the dummy leads can consist of silicon oxide, borophosphosilicate glass or phosphosilicate glass, also from the group comprising aluminum, polycide and polysilicon.

Figure 6:
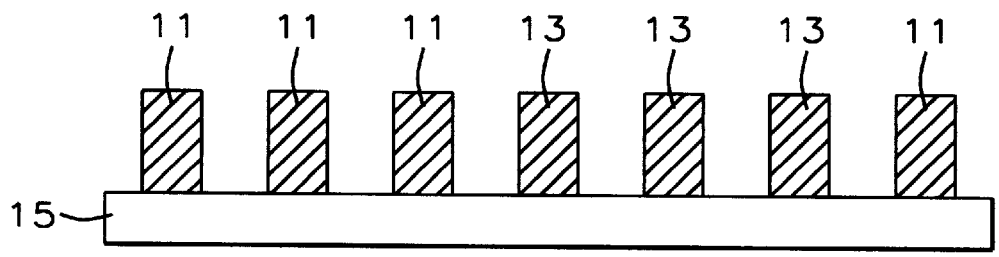

FIG. 6 presents a cross-sectional view of the base layer 15 after a silicon oxide device structure pattern 11 and a dummy pattern 13 have been deposited. The device pattern deposition 11 as shown forms a closely spaced area of the product design; the dummy pattern 13 has been deposited in a large or wide area of the product design.

Figure 7:
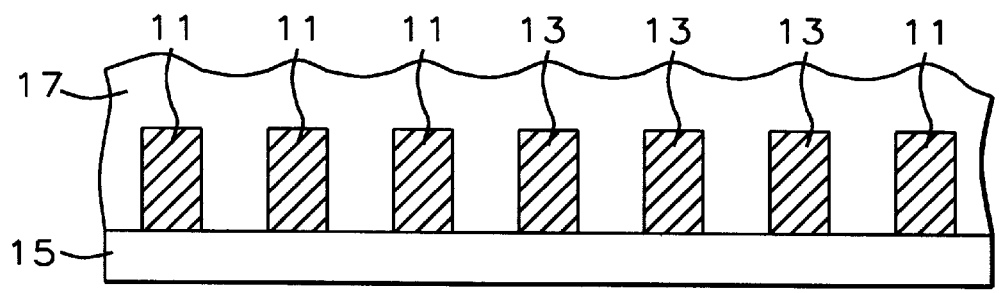

FIG. 7 shows a cross-sectional view after metal deposition 12 of the filler material has been completed.

Figure 8:
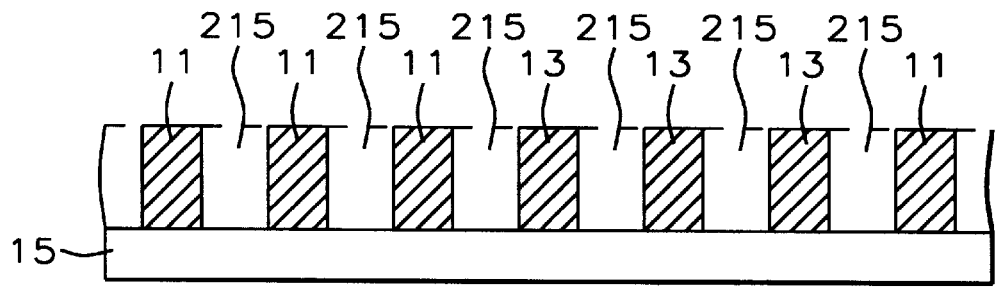

FIG. 8 shows the cross-section after metal CMP has been performed. The deposited filler material is highlighted by the areas 215 in this figure. The bulk metal filler material in the cell or the circuit may be part of the electrically connected circuit but does not have to be part of the circuit.

Figure 9:
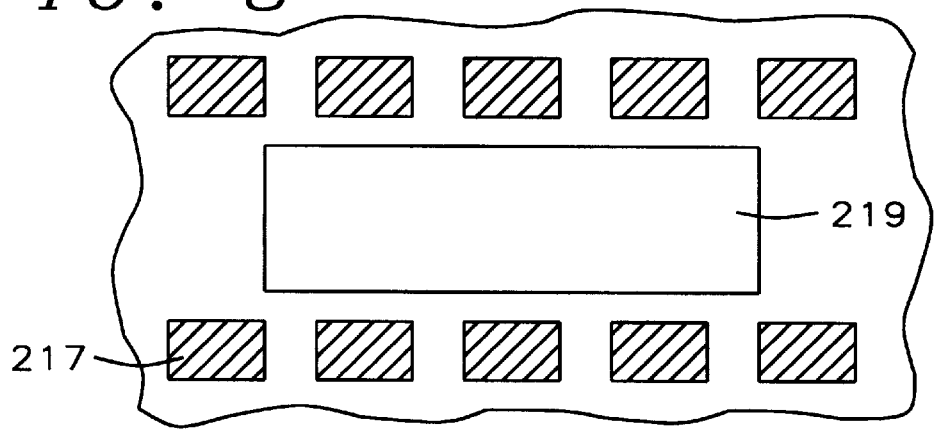

FIG. 9 shows a plan view of where the preferred embodiment of the present invention is most likely to be of major value, that is in the contact pads 217 used to connect the Integrated Circuit (IC) 219 to the circuits and components to which the IC 219 is connected. The present invention however does not have to be limited to this application and can, where-appropriated, be used within the layout of the IC itself.

It will be understood that the method in accordance with the present invention offers advantages over prior art methods in improving contact pad reliability, improving metal layer planarization and the collection of electrical data for Damascene processing. While the present invention has been shown in detail and described with reference to the preferred embodiment, it will be understood by those skilled in the art that various changes in form and details may be made without departing from the spirit and the scope of the present invention.

What is claimed is:

1. A method of forming an integrated circuit having an improved bonding pad which resists bonding pad peeling, the method comprising:

providing a substrate having active or passive devices formed thereon or therein and having a substrate surface for forming bonding pads;

forming a first insulating layer over said substrate surface;

masking and etching said first insulating layer to form an array of insulator lines wherein said insulator lines are closely spaced in first areas and widely spaced in second areas;

forming dummy leads in said second areas, wherein the dummy leads are coplanar with the insulator lines;

depositing a filler material over said insulator lines and dummy leads; and performing Chemical Mechanical Planarization to etch away said filler material down to the top surface of said insulator lines and said of dummy leads.

2. The method of claim 1, wherein said dummy leads are formed of silicon oxide.

3. The method of claim 1 which further includes forming a dielectric layer on the substrate surface; this processing step to be performed after said step of forming dummy leads in said second areas.

4. The method of claim 1 wherein said dummy leads are square in shape when viewed from above.

5. The method of claim 1 wherein said dummy leads are square in shape when viewed from a plane perpendicular to said substrate.

6. The method of claim 1 wherein said dummy lead are formed to be round in shape when viewed from above.

7. The method of claim 1 where said dummy leads have geometric shape when viewed from above.

8. A method of forming an integrated circuit having an improved bonding pad which resists bonding pad peeling, the method comprising:

providing a substrate having active or passive devices formed thereon or therein and having a substrate surface for forming bonding pads;

forming a first insulative layer over said substrate surface;

masking and etching said first insulative layer to form an array of insulator lines wherein said insulator lines are closely spaced in first areas and widely spaced in second areas;

forming dummy leads in said second areas using reverse tone mask processing, wherein the dummy leads are coplanar with the insulator lines;

depositing a filler material over said insulator lines and dummy leads; and performing Chemical Mechanical Planarization to etch away said filler material down to the top surface of said insulator lines and said of dummy leads.

9. The method of claim 8 wherein said dummy leads are formed of silicon oxide.

10. The method of claim 8 further includes forming a dielectric layer on the substrate, this processing step to be performed after said step of forming dummy leads in said second areas.

11. The method of claim 8 wherein the said dummy leads are square in shape when viewed from above.

12. The method of claim 8 wherein said dummy leads are square in shape when viewed from a plane perpendicular to said substrate.

13. The method of claim 8 wherein said dummy leads are formed to be round in shape when viewed from above.

14. The method of claim 8 where said dummy leads have geometric shape when viewed from above.

15. A method of forming an integrated circuit an improved bulk metal pattern design, the method comprising:

providing a substrate having active or passive devices formed thereon or therein and having a substrate surface for forming bonding pads and for forming integrated circuit having metal signal lines;

forming a first insulator layer over said substrate surface;

masking and etching said first insulator layer to form an array of insulator lines wherein said masking and etching may result in creating insulator lines arranged in open or widely spaced areas of the bulk metal;

forming dummy leads in said widely spaced areas and in areas between said insulator lines; depositing a filler material over said widely spaced areas and the insulator lines with said deposited filler material; and performing Chemical Mechanical Planarization to etch away said filler material down to the top surface of said insulator lines and said array of dummy leads.

* * * * *